(12) United States Patent
Ziemba et al.

(10) Patent No.: US 10,790,816 B2
(45) Date of Patent: Sep. 29, 2020

(54) SOLID-STATE REPLACEMENT FOR TUBE-BASED MODULATORS

(71) Applicant: Eagle Harbor Technologies, Inc., Seattle, WA (US)

(72) Inventors: Timothy Ziemba, Bainbridge, WA (US); Kenneth E. Miller, Seattle, WA (US); John Carscadden, Seattle, WA (US); James Prager, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

(21) Appl. No.: 14/606,828

(22) Filed: Jan. 27, 2015

(65) Prior Publication Data
US 2015/0303914 A1 Oct. 22, 2015

Related U.S. Application Data

(60) Provisional application No. 61/931,818, filed on Jan. 27, 2014.

(51) Int. Cl.
*H03K 17/60* (2006.01)
*H03K 17/567* (2006.01)
*H03K 17/04* (2006.01)

(52) U.S. Cl.
CPC ....... *H03K 17/567* (2013.01); *H03K 17/0406* (2013.01)

(58) Field of Classification Search
CPC .................................................. H03K 17/567
USPC ....................................................... 327/432
See application file for complete search history.

(56) References Cited

U.S. PATENT DOCUMENTS

| | | |
|---|---|---|
| 5,313,481 A | 5/1994 | Cook et al. |
| 5,321,597 A | 6/1994 | Alacoque |
| 5,392,043 A | 2/1995 | Ribner |
| 5,808,504 A | 9/1998 | Chikai et al. |
| 5,905,646 A * | 5/1999 | Crewson ................. H03K 3/57 363/132 |
| 6,320,362 B1 * | 11/2001 | Baek .................... H02M 1/088 323/281 |
| 6,359,542 B1 | 3/2002 | Widmayer et al. |
| 6,577,135 B1 | 6/2003 | Matthews et al. |
| 6,741,120 B1 | 5/2004 | Tan |
| 6,831,377 B2 | 12/2004 | Yampolsky |
| 6,897,574 B2 | 5/2005 | Vaysse |

(Continued)

FOREIGN PATENT DOCUMENTS

EP 1515430 3/2005

OTHER PUBLICATIONS

Bland, M., et al., "A High Power RF Power Supply for High Energy Physics Applications," Proceedings of the Particle Accelerator Conference, Knoxville, TN, May 16-20, 2005, pp. 4018-4020.

(Continued)

*Primary Examiner* — Metasebia T Retebo

(57) ABSTRACT

Embodiments described herein include a solid-state switch tube replacement for the radar system such as, for example, the SPY-1 radar system. Some embodiments provide for a technology for the precision switching that enables IGBT power modules to operate robustly in a series configuration and/or a parallel configuration to produce precision switching at high voltage (e.g., 20 kV and above) and high frequencies (e.g., 1 MHz and above).

11 Claims, 10 Drawing Sheets

(56) References Cited

U.S. PATENT DOCUMENTS

| | | | |
|---|---|---|---|
| 6,900,557 B1* | 5/2005 | Gaudreau | H02M 1/088 307/113 |
| 7,061,230 B2 | 6/2006 | Kleine | |
| 7,180,082 B1 | 2/2007 | Hassanein | |
| 7,307,375 B2 | 12/2007 | Smith et al. | |
| 7,319,579 B2 | 1/2008 | Inoue et al. | |
| 7,492,138 B2 | 2/2009 | Zhang et al. | |
| 7,605,385 B2 | 10/2009 | Bauer | |
| 7,901,930 B2 | 3/2011 | Kuthi et al. | |
| 7,948,185 B2 | 5/2011 | Smith et al. | |
| 8,093,979 B2 | 1/2012 | Wilson | |
| 8,115,343 B2 | 2/2012 | Sanders et al. | |
| 8,143,790 B2 | 3/2012 | Smith et al. | |
| 8,624,536 B2* | 1/2014 | Zhao | H02H 7/0838 318/280 |
| 8,723,591 B2* | 5/2014 | Lee | H03K 17/168 323/271 |
| 8,773,184 B1 | 7/2014 | Petrov | |
| 8,963,377 B2 | 2/2015 | Ziemba et al. | |
| 9,329,265 B2* | 5/2016 | Murad | G01S 7/2813 |
| 2001/0008552 A1 | 7/2001 | Harada | |
| 2003/0169107 A1 | 9/2003 | LeChevalier | |
| 2006/0210020 A1 | 9/2006 | Takahashi | |
| 2007/0018504 A1 | 1/2007 | Wiener et al. | |
| 2007/0115705 A1 | 5/2007 | Gotzenberger | |
| 2008/0062733 A1 | 3/2008 | Gay | |
| 2008/0143260 A1 | 6/2008 | Tuymer | |
| 2008/0198634 A1 | 8/2008 | Scheel | |
| 2010/0007358 A1 | 1/2010 | Schaerrer | |
| 2010/0284208 A1* | 11/2010 | Nguyen | H02M 7/4807 363/160 |
| 2012/0138123 A1* | 6/2012 | Newdoll | F24J 2/461 136/246 |
| 2012/0155613 A1 | 6/2012 | Caiafa | |
| 2013/0113650 A1 | 5/2013 | Behbahani et al. | |
| 2014/0109886 A1 | 4/2014 | Singleton et al. | |
| 2014/0146571 A1 | 5/2014 | Ryoo | |
| 2014/0268968 A1 | 9/2014 | Richardson | |
| 2014/0354343 A1 | 12/2014 | Ziemba et al. | |
| 2015/0028932 A1 | 1/2015 | Ziemba et al. | |
| 2015/0070802 A1* | 3/2015 | Dong | H02H 3/16 361/49 |
| 2015/0076372 A1 | 3/2015 | Ziemba et al. | |
| 2015/0130525 A1 | 5/2015 | Miller et al. | |
| 2015/0256086 A1 | 9/2015 | Miller et al. | |
| 2015/0303914 A1 | 10/2015 | Ziemba et al. | |
| 2015/0318846 A1 | 11/2015 | Prager et al. | |
| 2016/0065127 A1* | 3/2016 | Newdoll | H02S 50/00 136/246 |

OTHER PUBLICATIONS

In, Y., et al., "On the roles of direct feedback and error field correction in stabilizing resistive-wall modes," Nuclear Fusion, 2010, retrieved from p://stacks.iop.org/NF/50/042001 on Apr. 12, 2012, vol. 50, No. 4, 5 pages.

Kim, J., et al., "High Voltage Pulsed Power Supply Using IGBT Stacks," IEEE Transactions on Dielectrics and Electrical Insulation, Aug. 2007, vol. 14, No. 4, 921-926.

Locher, R., "Introduction to Power MOSFETs and their Applications (Application Note 558)," Fairchild Semiconductor, Oct. 1998, 15 pages.

Locher, R., et al., "Use of BiMOSFETs in Modern Radar Transmitters," IEEE International Conference on Power Electronics and Drive Systems, Indonesia, 2001, pp. 776-782.

Reass, W., et al., "Progress Towards a 20 KV, 2 KA Plasma Source Ion Implantation Modulator for Automotive Production of Diamond Film on Aluminum," Submitted to 22nd International Power Symposium, Boca Raton, FL, Jun. 24-27, 1996, 6 pages.

Scoville, J., et al., "The Resistive Wall Mode Feedback Control System on DIII-D," IEEE/NPSS 18th Symposium on Fusion Engineering, Albuquerque, NM, Oct. 25-29, 1999, General Atomics Report GAA23256, Nov. 1999, 7 pages.

Zavadtsev, D., et al., "Compact Electron Linear Accelerator RELUS-5 for Radiation Technology Application," 10th European Particle Accelerator Conference, Edinburgh, UK, Jun. 26-30, 2006, 3 pages.

International Search Report and Written Opinion dated Sep. 15, 2014 as received in PCT Application No. PCT/US2014/04029.

International Search Report and Written Opinion dated Feb. 20, 2015 in related PCT application No. PCT/US2014/065832 (14 pages).

A. Starikovskiy and N. Aleksandrov, "Plasma-assisted ignition and combustion," Progress in Energy and Combustion Science, 39, Feb. 1, 2013, pp. 61-110.

Gaudet, J., et al, "Research Issues in Developing Compact Pulsed Power for High Peak Power Applications on Mobile Platforms," Proc. IEEE, 92, Jun. 7, 2004, pp. 1144-1165.

D.A. Singleton et al. "Compact Pulsed-Power System for Transient Plasma Ignition," IEEE Trans. Plasma Sci., 37, Aug. 12, 2009 pp. 2275-2279.

Wang, F., "Compact High Repetition Rate Pseudospark Pulse Generator," IEEE Trans. Plasma Sci., 33, Aug. 4, 2005 pp. 1177-1181.

Singleton, D. R., "Low Energy Compact Power Modulators for Transient Plasma Ignition," IEEE Trans. Dielectr. Electr. Insul., 18, Aug. 4, 2011, pp. 1084-1090.

Rao, X., et al., "Combustion Dynamics of Plasma-Enhansed Premixed and Nonpremixed Flames," IEEE Trans. Plasma Sci., 38, Nov. 12, 2010 pp. 3265-3271.

Pokryvailo, A., et al, "A 1KW Pulsed Corona System for Pollution Control Applications." 14th IEEE International Pulsed Power Conference, Dallas, TX, USA, Jun. 15-18, 2003.

Pokryvailo, A., et al, "High-Power Pulsed Corona for Treatment of Pollutants in Heterogeneous Media," IEEE Trans. Plasma Sci., 34, Oct. 5, 2006, pp. 1731-1743.

Dammertz, G., et al, "Development of Multimegawatt Gyrotrons for Fusion Plasma Heating and Current Drive," IEEE Trans. Elec. Devices., 52, Apr. 5, 2005, pp. 808-817.

Zhu, Z., et al, "High Voltage pulser with a fast fall-time for plasma immersion ion implantation," Review Sci Inst., 82, 045102, Apr. 2011.

Sanders, J., et al, "Scalable, Compact, Nanosecond Pulse Generation with a High Repetition Rate for Biomedical Applications Requiring Intense Electric Fields," Pulsed Power Conference, 2009. PPC '09. IEEE, Washington, DC, Jun. 28, 2009-Jul. 2, 2009.

Schamiloglu, E., et al, "Scanning the Technology: Modern Pulsed Power: Charlie Martin and Beyond," Proc. IEEE, 92, Jun. 7, 2004, pp. 1014-1020.

Garwin, Richard, "Pulsed Power Peer Review Committee Report," Sandia National Laboratories Report, SAND2000-2515, Oct. 2000.

International Search Report and Written Opinion dated Oct. 6, 2015 in related PCT application No. PCT/US2015/040204 (15 pages).

International Search Report and Written Opinion dated Jul. 14, 2015 in related PCT application No. PCT/US15/18349 (11 pages).

* cited by examiner

SOLID-STATE REPLACEMENT FOR TUBE-BASED MODULATORS

BACKGROUND

High power radar systems are an important component of naval warfare systems, but they can be costly to operate and maintain. A study conducted by the Graduate School of Business and Public Policy at the Naval Post Graduate School outlines the issues surrounding life-cycle cost for the several of the key radar components commonly used throughout the U.S. Navy. The report focuses on the Cross-Field Amplifier (CFA) found in the AN/SPY-1 radar system and documents a successful reduction of overall life-cycle cost by implementation of a quality and inventory control programs for the CFA manufacturing and repair. This program alone reduced the operating cost from over $7.00 per operating hour to less than $1.00 per operating hour from 1983 to 2002. However, due to the large number of tubes used throughout the fleet, life-cycle costs are an issue, and even a small reduction in cost per operating hour of $0.01 will lead to a substantial annual cost saving of over $480,000.00 in 2006 dollars.

CFA tubes in the SPY-1 radar system contain several sub-assemblies including the switch tube, switch driver, and high voltage power supplies used in the Final Power Amplifier (FPA) cabinet. Many of these items have been identified as high failure items and severely affect the life-cycle cost of the system. Additionally, the vacuum tube technology used for the switch tube is becoming obsolete with limited manufacturing options further driving up overall life-cycle costs. A solution to this problem would be to replace the electronic switch system with currently available solid-state driver technology. Solid-state switching technology has already been utilized in lower power radar and microwave applications. Wide use and availability of solid-state switching devices could significantly reduce cost. Manufacturing techniques for solid state devices have very high quality control allowing for very long mean time between failures when used in switching power supply applications.

Considerable challenges exist when attempting to replace the high power and high voltage vacuum switch tube and associated systems used for the SPY-1 Radar CFA with solid-state devices. These issues include fault tolerance in high voltage applications, series arrangement of lower voltage devices while maintaining very fast rise/fall time times (~100 ns), providing the constant current output inherent to the switch tube, overcurrent (arc) detection and suppression and ease of repair with maintaining high voltage isolation. Attempts have been made to provide a solid-state alternative to the switch tube assembly without success. The difficulty of this approach was clearly demonstrated in 1988 by Raytheon Corporation where 80 individual 250 V, Field Effect Transistors (FET) were arranged in a series configuration to provide a high voltage output (~18 kV). This system addressed many of the issues needed for a suitable switch tube replacement, including fault detection and constant current output.

Advances in solid-state technology have significantly increased device capabilities since 1988, but in many ways the problems associated with the Raytheon constant current, solid-state modulator are the same. Series configurations are still challenging, and at the necessary voltage and power levels may, for example, require many MOSFETs in series, due to maximum operational voltages near 500 V for devices that can source the required current.

SUMMARY

Embodiments described herein include a solid-state switch tube replacement for the radar system such as, for example, the SPY-1 radar system. Some embodiments provide for a technology for the precision switching that enables IGBT power modules to operate robustly in a series configuration and/or a parallel configuration to produce precision switching at high voltage (e.g., 20 kV and above) and high frequencies (e.g., 1 MHz and above).

BRIEF DESCRIPTION OF THE DRAWINGS

Illustrative embodiments of the present invention are described in detail below with reference to the following figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label

DETAILED DESCRIPTION

A robust, modular, IGBT-based system that has capabilities that can provide a solid-state solution to replace common radar switch tubes is disclosed in various embodiments. In some embodiments, the IGBT system may be used to replace tubes in a SPY-1 CFA radars. In some embodiments this Integrated Power Module (IPM) is an innovative IGBT-based system designed as a high power, RF tube replacement module. The system can be modular Sc to allow for easy series/parallel configuration for several applications. Each module can be capable of high power switching at high frequency.

Embodiments described herein may include one or more of the following, be Sa capable of performing one or more of the following and/or have one or more of the following advantages:

- Base unit was designed for over 1.2 kV at 600 A continuous.
- Base unit capable of pulsed output currents (e.g, >2500 A) for 1 ms while switching at high frequency (e.g., >1 MHz).
- Fast rise/fall times (e.g., <40 ns).
- Series stacking capability at high voltage and power (14 kV & 1 kA).
- Pulse-width modulation (PWM) capability at high frequency >1 MHz.
- Utilizes fiber optic control/isolation.
- On board over current/voltage monitor with rapid fault detection and system shut down with approximately 100 ns response time.
- High voltage isolation (e.g., greater than 30 kV).
- Can be used with non-isolated 48 V input power.
- High switching efficiency (e.g., >90%) even at high frequencies.
- Non-potted, allowing ease of repair.
- Low jitter operation for robust series stacking (e.g., <10 ns).

Figure 1:
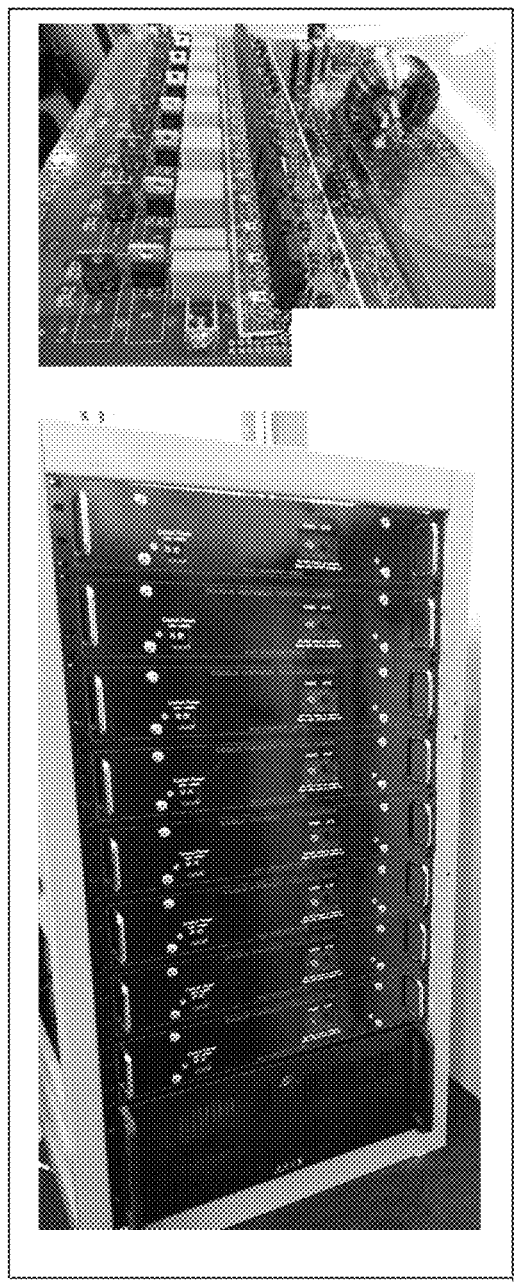
FIG. 1 is an example of an IPM-16P board and Eight IPM modules in a 2U rack mount format according to some embodiments described herein.

FIG. 1 illustrates an example of a single IPM board (Top) prior to being inserted into a rack-mountable unit and an assembly of eight units (Bottom) in a 4 ft. rack. As stated above, these units can easily be arranged in a series configuration and/or a parallel configuration depending on application requirements. The IPM can include several discrete IGBTs in parallel and can have similar output power to off-the-shelf brick IGBTs. Discrete IGBTs have a much lower cost-per-watt. They are more easily incorporated into printed circuit board (PCB) designs in series/parallel allowing the same low-cost board design to be used for many applications simply by changing the flavor of the discrete IGBT. The IPM in FIG. 1 includes up to 16 IGBTs arranged in parallel across the board. Each IGBT also has its own snubber circuit and a driver circuit. While 16 IGBTs are shown, any number of IGBTs may be used. In some embodiments, the IPM may include 48 V DC input power. Each IPM can have an onboard custom high power (e.g., >200 W) DC-DC converter to supply the necessary DC control voltages. In some embodiments, the boards can include voltage isolation (e.g., 30 kV) by using a custom high voltage isolation transformer, which can also be seen in FIG. 1. Higher isolation is possible with additional transformers.

IGBT triggering and switching control can be accomplished via, for example, a fiber optic receiver that is, for example, capable of over 155 megabit per second data rates in combination with fast (e.g., <5 ns) logic. This combination can, for example, allow for extremely fast, high current IGBT gate control allowing for high power switching while reducing board-to-board jitter. The board may also incorporate a low inductance high current connector block to allow for both parallel and series configurations. When assembled each unit may be fully shielded for EMI protection.

Figure 2:
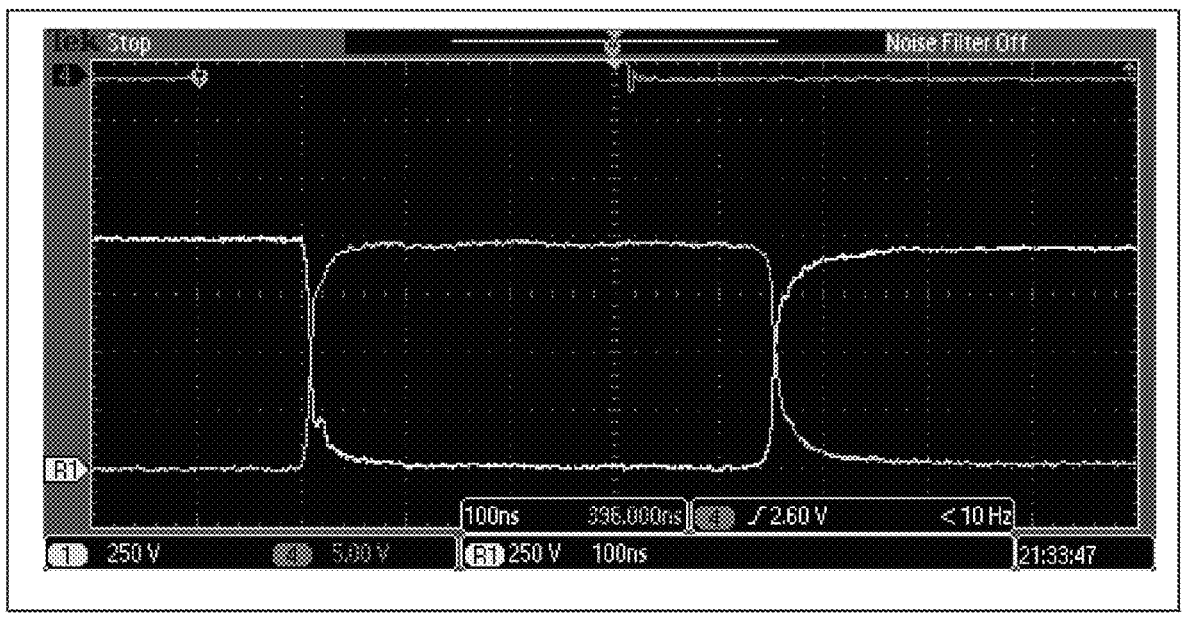
FIG. 2 is an example of a switching profile of an IPM for 370 A at 1 kV at 1.25 MHz. R1 according to some embodiments described herein.

FIG. 2 shows the measured voltage and current profiles, for example, for IPM switching 370 A at 1 kV into a resistive load at 1.25 MHz. The reference (R1) shows the collector-emitter voltage ($V_{ce}$) and Ch1 shows the load voltage ($V_{load}$), which is a proxy for current. In this data, the 40 ns switching rise time of $V_{ce}$ is clearly visible. The IPM design minimizes board and circuit inductance to reduce switching voltage spike and the unit incorporates on board snubbers that can be sized to meet the correct application.

The IPM can have, for example, a voltage rating of 1200 kV at 2500 A pulsed. Various other voltage values and current values may also be used. For example, a voltage rating above 800 kV and currents above 1500 A may be produced. These ratings, however, far exceeds what is necessary for a CFA switch tube replacement. A single IGBT channel of the IPM module can be used and arranged into a single board series configuration, which can be capable of the switching, for example, 20 kV with a continuous current rating of 40 A.

In some embodiments, for example, a series configuration of approximately 20 channels can be produced and tested as we have confidence that the necessary rise and fall times can be obtained with 1200 V IGBTs currently used in the IPM module. The fast switching capability of the new 20 kV module is critical, as it is necessary to allow for the pulse-width modulation (PWM) of the switch tube replacement to maintain relatively constant current output. The innovative design for fast PWM, constant current control will be discussed in detail in the technical objective section. Higher voltage discrete IGBTs are available up to 4 kV ratings at the necessary output current levels. In some embodiments, if rise/fall time can be maintained with higher voltage IGBTs then the total number of series channels can correspondingly be reduced.

Figure 3:
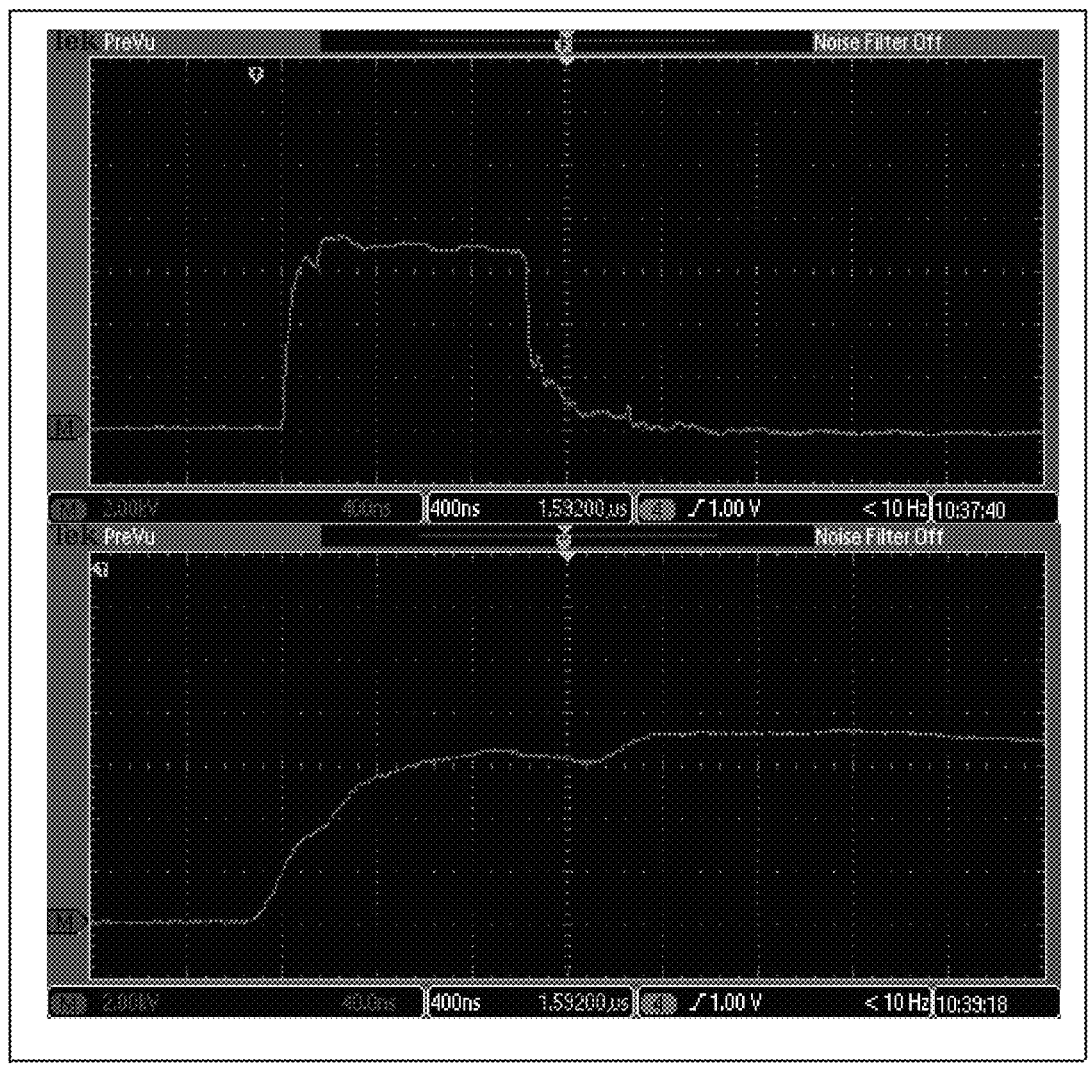
FIG. 3 is an example of a load voltage for series operation at 7 kV, 1 µs pulsed duration and expanded scale showing ~40 ns rise time according to some embodiments described herein.

As stated above, series operation of IGBT configurations can be difficult, especially for high frequency operation (e.g., ~1 MHz), and switching jitter from one IGBT module to another may be minimized for robust operation. FIG. 3 shows examples of results for an IPM configured for series operation. Here six modules, each populated with a single IGBT was used to determine voltage sharing and rise time for series operation. The stack was switched 100 A at over 7 kV. Traces in FIG. 3 show the output load voltage for a 1 μs pulse, as well as an expanded view showing the turn on rise time. Here the pulse is seen to reach 7 kV within 40 ns, verifying a very fast rise time for series operation. For this setup the slew rate is over 100 kV/μs. Falls times are seen to decrease a similar rate from the 100% to approximately 50% value, then slow due to the tail current effect of the IGBTs, which meets the specification as noted in the Phase I solicitation. In some embodiments, tall times for a given application can be increased with the use of a tailbiter circuit.

Figure 4:
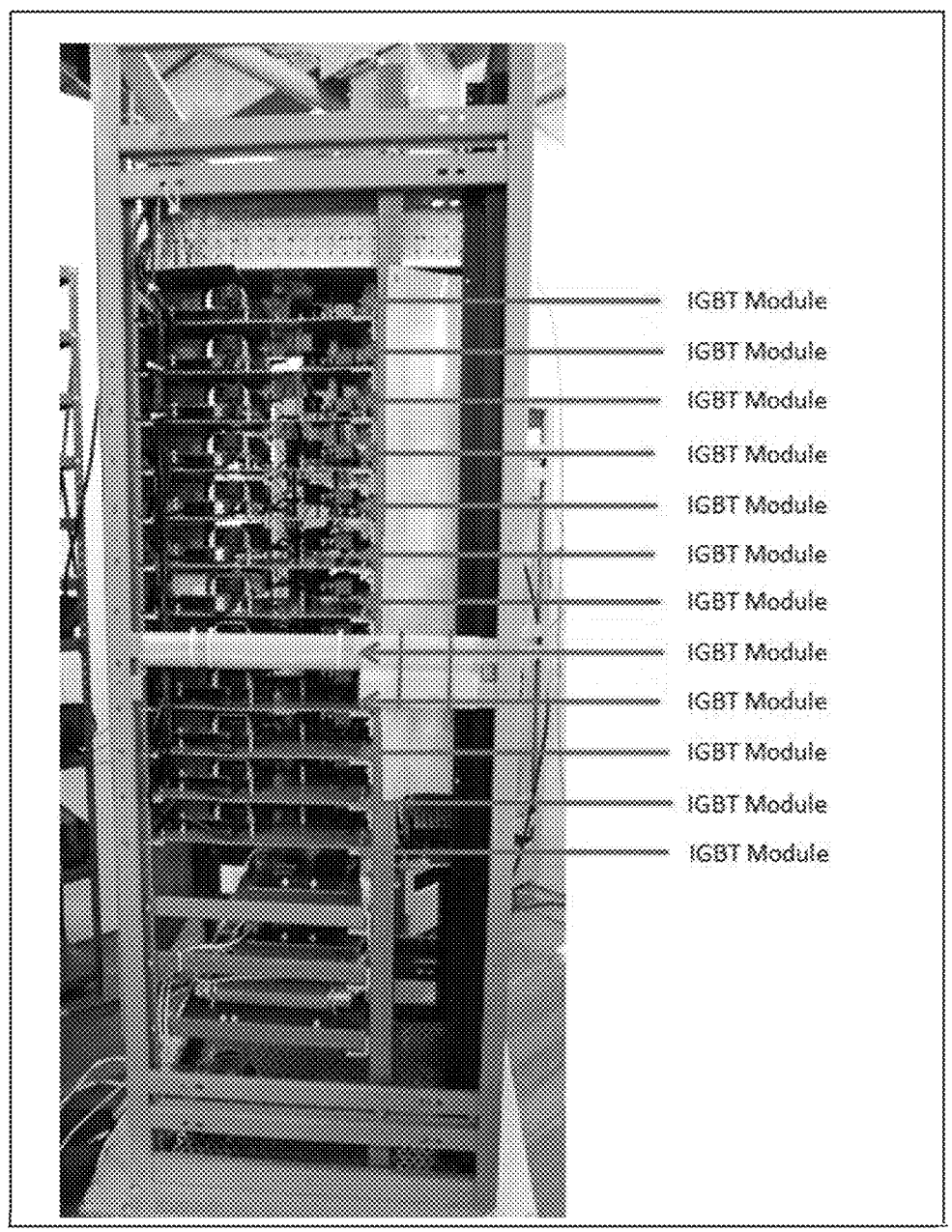
FIG. 4 is an example of a 10 kV, 1 kA series stack of IGBT modules according to some embodiments described herein.

Some embodiments can use larger series stacks of IGBTs operating at higher voltage and current levels. In some embodiments these IGBT stacks can be designed and constructed in a series stack using twelve IPMs, which was utilized as an electron gun driver. This system was designed for nominal output of −10 kV and 500 A and 14.4 kV peak and 1 kA. FIG. 4 shows an example of a power supply arrangement. Due to the high output power (e.g., 5 MW pulsed) of this system, associated energy storage capacitors, and current limiting resistors, this power supply can be rack sized.

Figure 5:
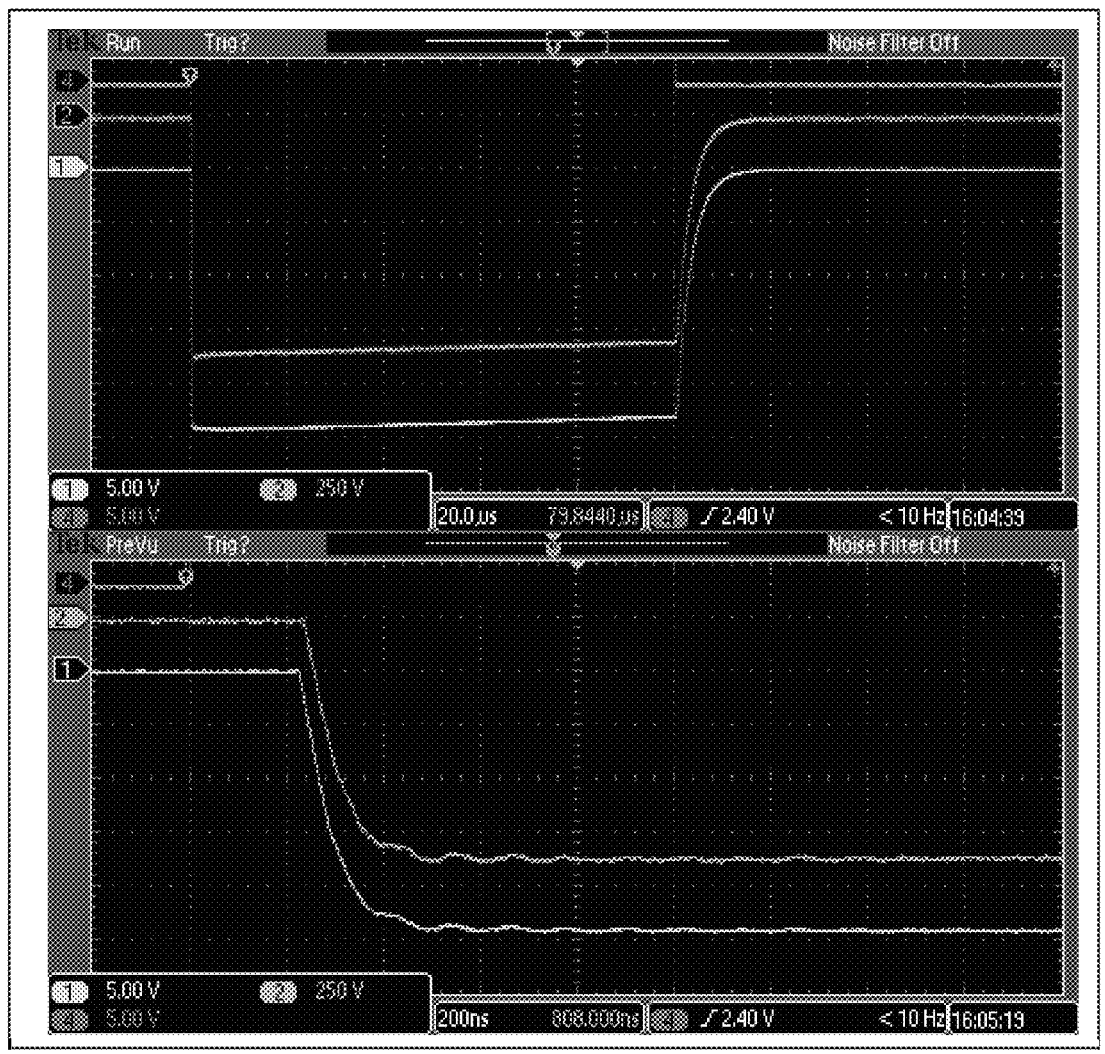
FIG. 5 is an example of IPM 10 kV power supply test traces.

FIG. 5 shows examples of test traces from the −10 kV power supply. The load current (Ch1) was monitored by a 0.05 V/A current transformer, and the load voltage (Ch2) was monitored through a resistive 10 to 1 voltage divider. The upper image shows a 100 μs pulse. The lower image is the same pulse with an expanded timescale. From this data, the rise time is measured to be ~120 ns. It should be noted that in this supply rise time was intentionally slowed down for the electron gun application by modifying the gate resistance of the IGBTs, and in principle it could be much faster. Fall times in this supply were also lengthened as a result of the snubbers utilized on each IPM. This supply serves as an excellent demonstration of the robust (low jitter) switching, fast rise time, and series stacking capabilities of the IPM system.

Series stacking of IGBT modules is critical to produce a reasonably sized solid-state switch tube replacement. However a high voltage IGBT switch alone will not mimic the near constant current output of the tetrode switch tube. The near constant current behavior for the switch tube is desirable so that output power of the CFA is held nearly constant as frequency is adjusted. In fact due to the very low impedance of the IGBTs they will effectively act as a near constant voltage source meaning sudden load changes of the CFA dynamic impedance will be meet with an increase or decrease in CFA current. Maintaining constant current in the CFA for changes in dynamic impedance may be a difficult challenge for the solid-state replacement.

In some embodiments, the switch current can be regulated. This method can effectively use the FET to change its dynamic impedance by selecting appropriate gate drive and feedback resistors to control the FET.

In some embodiments, a simple buck converter topology utilizing a filter capacitor, a solid state switch and inductor can be employed to accomplish a constant current output. A small inductor may be included that not only saves on size and cost of the power supply but limits the amount of stray capacitance that can reduce charging speeds.

Figure 6:
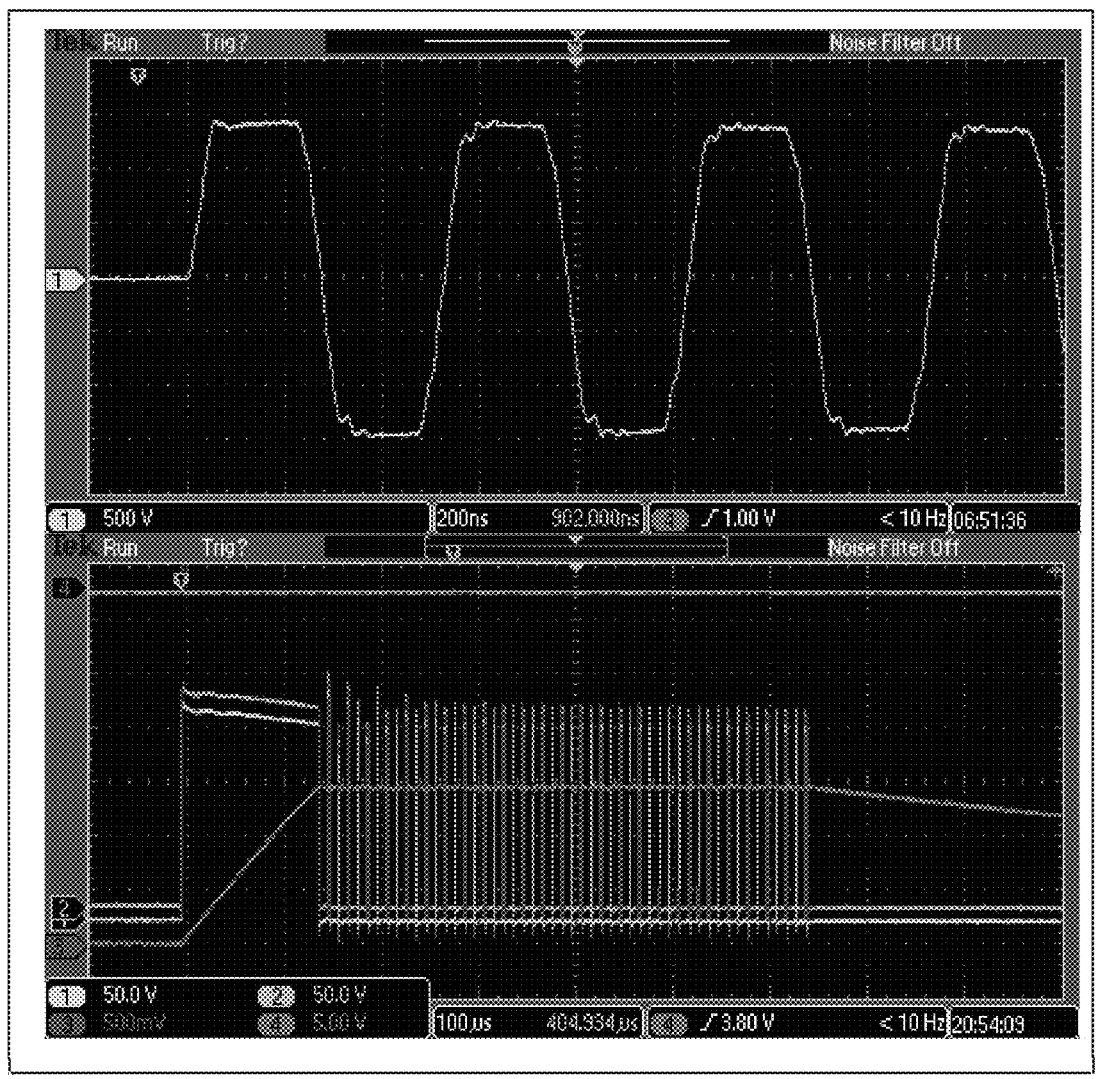
FIG. 6 is an example of 1500 V, 30 A (3000 V p-p), 2 MHz switching of the IMP and high frequency PWM to maintain constant current.

FIG. 6 shows an example of the ability of the IPM to accomplish very fast switching and its advantage for PWM over short time scales. Here the top trace shows that the IPM unit can switch repeatedly at frequencies near 2 MHz. The bottom trace shows measured data of testing the IPM using PWM to produce a constant current into a 100 pH inductive load. Initially, the current was allowed to ramp up to a high level with an initial long pulse with PWM thereafter to maintain constant current for the shot duration. The purple trace shows the current rise during the initial long pulse and then continues flat as the IGBTs switch on and off. This current is measured through a 0.01 V/A pearson probe with a 50Ω terminator, so the purple line corresponds to 100 A/division. Blue is $V_{ce}$, and yellow is $V_{load}$. In this example the current rise/fall times are application specific and do not reflect what may be required for the CFA application, however it can be seen that very low current ripple can be obtained using this method on appropriate time scales (~100 μs) with fast switching.

To successfully replace the CFA switch tube and associated systems with solid-state technology while meeting the specified rise/fall and constant current specifications can be a difficult task. A novel high voltage IGBT-based switching design that incorporates the use of the fast switching, high voltage series stacking, and the 1 MHz PWM capability of an IPM system to provide a reliable solid-state solution for a switch tube replacement is disclosed.

Figure 7:
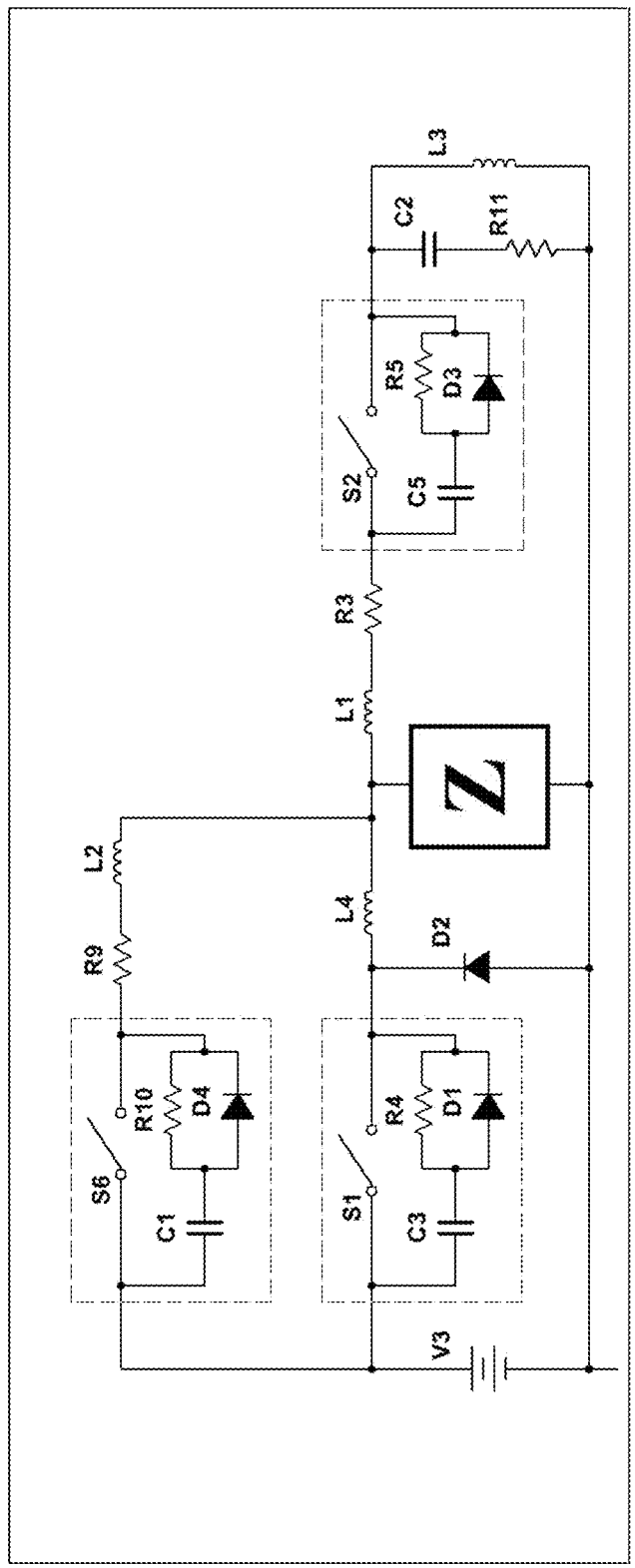
FIG. 7 is an example of circuit diagram of proposed solid-state CFA driver system based on the IPM technology.

A circuit diagram for a driver system is shown in FIG. 7. The driver uses three IPM switches, each with an RCD snubber, to create a pulse with a fast rise, flat top, and fast fall. The dynamic impedance of the CFA is shown as the box marked "Z." To produce a constant current source, the supply must be capable of PWM the output using Switch 1 (S1). In this case a buck converter was chosen, which consists of the PWM switch (S1), a diode (D2), and an inductor (L4). The switch is operated at 1 MHz with a duty cycle to step down from 17.4 kV to 13.6 kV. These values are arbitrary but are based on examples discussed for CFAs in references 2 and 3. The size of the inductor dictates the size of the current ripple. In this case, ~30 mH may be useful for exceeding the ±0.1 A ripple.

With this large inductance, this buck converter operating alone would not be capable of producing the fast rise and fall times for the CFA driver application. To accomplish the fast rise, two additional switches were added. To start the pulse, the PWM switch and tailbiter switch (S2) are both closed allowing current to ramp up through L4. During this time, there is no significant voltage across the load. Once the current reaches the nominal level, the tailbiter switch opens allowing the voltage to appear across the CFA. At this time the fast rise switch (S6) closes for 100 ns to rapidly charge the 80 pF capacitance in the CFA. This allows the current to rise in approximately 100 ns. By adjusting the resistance (R9) and inductance (L2) in this branch, the exact rise time can be dialed to reach any value in the range 75-125 ns while achieving a cathode voltage slew rate of 80-130 kV/μs at 70%.

At the same time the fast rise switch closed, the PWM switch begins modulating the output of the buck to maintain a flat current profile for the CFA and continues for 100 μs. At the end of the pulse, the PWM switch is opened and the tailbiter switch is closed a second time. This rapidly discharges the 80 pF capacitance of the CFA in 150 ns. Any potential turnoff spike or oscillation is damped by the LCR filter (L3, C2, and R11).

Some embodiments can include an IPM Module in a 20 kV Series Configuration. Some embodiments can include an IPM for series configuration that includes additional fiber optic fans outs and isolated low voltage control. Some embodiments can include an IPM module as a 20 kV, 40 A, CFA Driver System.

Some embodiments can include a high voltage (20 kV or more) module that will be used as the basic solid-state switch. This switch can include a single channel design of an IPM module and to place that design into a series arrangement onto a single PCB board. The board design, for example, can incorporate all of the low inductance enhancements and/or component arrangement, which allow for incredibly fast switching of the IPM module.

Figure 8:
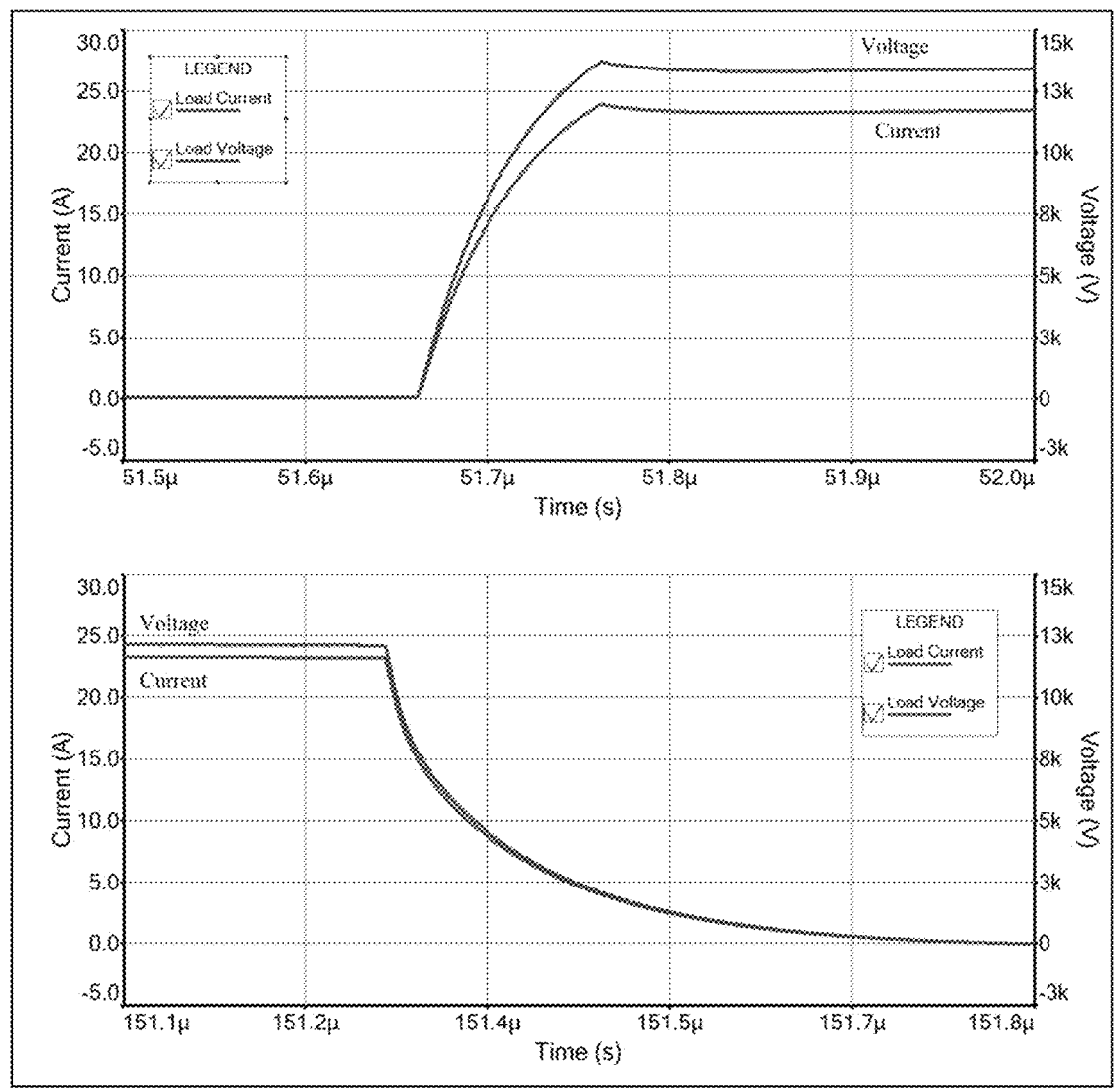
FIG. 8 is an example of SPICE modeling results of the IPM CFA system showing current and voltage rise time and fall times.

Some embodiments can include a driver system. FIG. 8 shows SPICE modeling results for a configuration demonstrating the expected rise time and pulsed duration. Here the current rises to the preprogrammed value (~23 A) within 125 ns and the fall time is within 200 ns. The system has a great deal of control over rise/fall times of the pulse due to the three independent switches. Care may need to be taken reduce stray inductance, which is modeled as L3 in FIG. 7.

Figure 9:
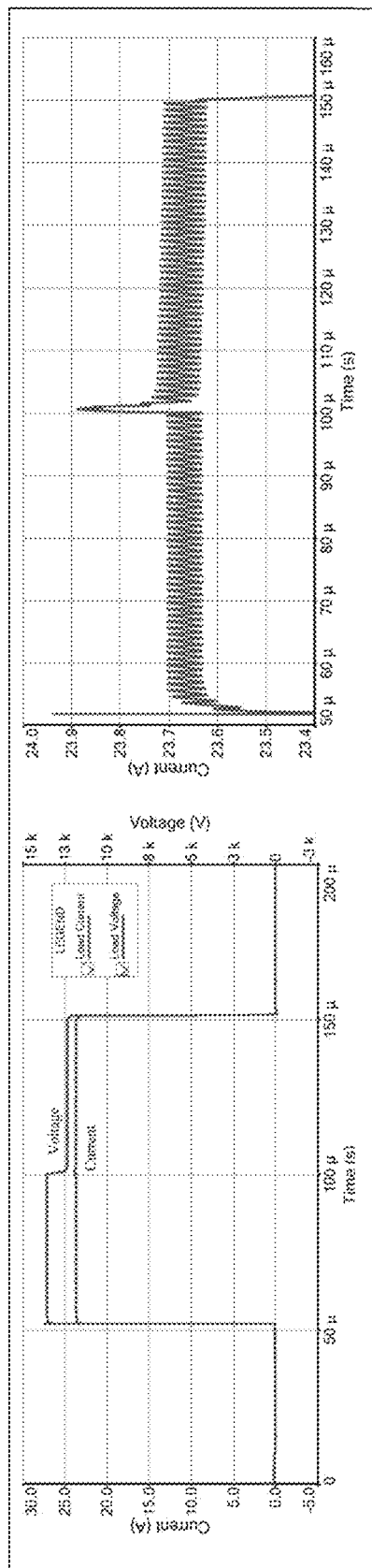
FIG. 9 is an example of SPICE modeling results of the IPM CFA system showing system response to a change in dynamic load 50 Aps into pulse.

The use of the independent switches to control rise/fall time along with the PWM switch decouples the issue of constant current output for the system. After the initial voltage on the CFA is obtained using the rise time switches, the PWM switch is used to maintain constant current. FIG. 9 shows that the current is regulated near 23.7 A. In this case 23.7 A is a consequence of the modeling parameters chosen and in practice the current amplitude could be precisely fixed to the desired nominal value or 22.7 A. The left plot shows the output current and voltage of the driver for a 100 μs pulse.

Here the PWM switch maintains the preprogrammed output current at the start of the pulse. After which the dynamic impedance is modeled to make a discrete change 50 μs into the pulse. The PWM switch responds to the change in impedance with a shift in pulse width, which reduces the load voltage and retains the constant current in the CFA. The current trace in FIG. 9 (Right) shows both the expected ripple in the load and the current response to the change in impedance. Here the ripple remains within the specified ±0.1 A with a brief spike in current of approximately 0.2 A with the change in impedance. The current returns to the programmed value within 1 µs. This method of using a PWM buck converter relies on the very fast (1 MHz) switching capability of the IPM module. In theory one could use a slower PWM frequency; however, this would necessitate a much larger buck inductor (L4 in FIG. 7).

As the L4 becomes ever larger issues with overall size, weight, and cost of this item become relevant. In the SPICE modeling above, L4 has an inductance of 30 mH. This high voltage inductor is very reasonable to make, and we estimate that will have an approximate volume of 6 in$^3$ with a weight around 10-20 lbs and cost approximately $1000.00 for single builds. However, typical switching frequencies for high power IGBT based systems are usually around 50 kHz. The corresponding inductor to accomplish the same task in this application is proportionally larger more complex and expensive. Additionally the amount of stored energy in the inductor is also much higher meaning more damage to the CFA if there is a switch failure. If the first objective produces a high voltage IPM unit then configuring them into the three switch configuration and testing is straight forward. The technical challenge will to minimize stray reactive elements that might lead to additional noise on the system. It is expected that testing with fine adjustments to the IPM modules will occur during this objective.

Figure 10:
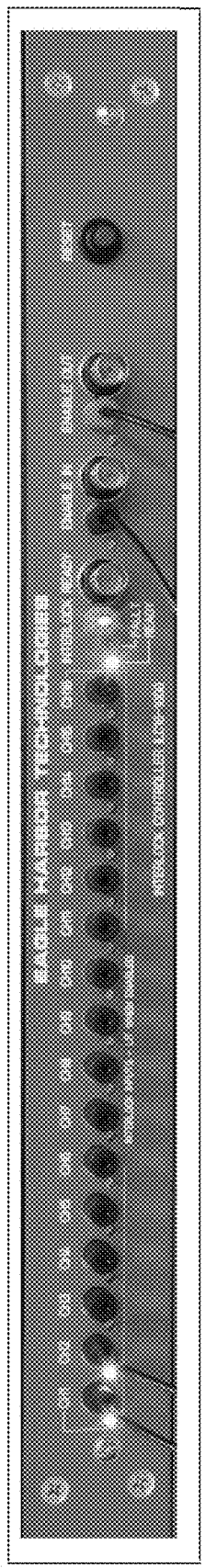
FIG. 10 is an example of an InterLock Controller, utilized for IPM series arrangements, provides fast (80 ns) response to faults when an over current/voltage is detected or if a fault is detected on the low voltage control power.

Some embodiments include a design that includes thermal management and/or system controller that will be able to control the PWM feedback as well as fault detection and mitigation. As stated above each IPM module can have the ability to detect overcurrent and overvoltage. Some embodiments can include a fault detection and controller for other series arrangement of IGBTs, which can monitor the individual channels for faults and shut down the system upon detection. The InterLock Controller (ILC) shown in FIG. 10 utilizes fast digital logic that can respond within 80 ns to detected fault. The controller effectively interrupts the control logic of all series switches causing them to close and save the system. The controller also has the ability to report faults to a software based controller, which can be programmed to fully disable the system or wait a specified time to clear if an arc or oscillation fault is detected. Similar logic will be integrated into the high voltage modules.

The ensuing description provides various embodiments of the invention only, and is not intended to limit the scope, applicability or configuration of the disclosure. Rather, the ensuing description of the embodiments will provide those skilled in the art with an enabling description for implementing an embodiment. It should be understood that various changes may be made in the function and arrangement of elements without departing from the spirit and scope as set forth in the appended claims.

That which is claimed:

1. A solid-state switch comprising:
   a plurality of IGBTs;
   a plurality of driver circuits, wherein each driver circuit of the plurality of driver circuits is coupled with only one IGBT of the plurality of IGBTs, and wherein each of the plurality of driver circuits comprise a fiber optic receiver;
   a plurality of snubber circuits, wherein at least one snubber circuit of the plurality of snubber circuits is coupled with one IGBT of the plurality of IGBTs, wherein each snubber circuit of the plurality of snubber circuits comprises a capacitor, and a parallel combination of a resistor and a diode; and
   wherein the solid-state switch produces an output with a pulse width modulation greater than 1 MHz and the output has a high voltage isolation greater than 30 kV,
   wherein the output has a rise time less than 40 ns; and
   wherein the solid-state switch produces output currents greater than 2000 A for 1 ms while switching at frequencies greater than 1 MHz.

2. The solid-state switch according to claim 1, further comprising a radar connection circuit that is configured to couple the solid-state switch with a SPY-1 radar.

3. The solid-state switch according to claim 1, wherein the solid-state switch produces 1.2 kV at 600 A.

4. The solid-state switch according to claim 1, wherein the output has fall times less than 40 ns.

5. The solid-state switch according to claim 1, wherein the solid-state switch comprises a fiber optic isolation input circuit.

6. The solid-state switch according to claim 1, wherein the solid-state switch produces an output with high switching efficiency of greater than 90% at high frequencies.

7. The solid-state switch according to claim 1, wherein the solid-state switch produces an output with jitter below 10 ns.

8. A solid-state switch comprising:
   a plurality of IGBTs;
   a plurality of driver circuits, wherein each driver circuit of the plurality of driver circuits is coupled with only one IGBT of the plurality of IGBTs; and
   a plurality of snubber circuits, wherein at least one snubber circuit of the plurality of snubber circuits is coupled with one IGBT of the plurality of IGBTs;
   wherein the solid-state switch produces an output with a pulse width modulation greater than 1 MHz and the output has a high voltage isolation greater than 30 kV;
   wherein the output has a rise time less than 40 ns; and
   wherein the solid-state switch produces output currents greater than 2000 A for 1 ms while switching at frequencies greater than 1 MHz.

9. The solid-state switch according to claim 8, further comprising a radar connection that couples the solid-state switch with a radar such that the output of the solid state switch is communicated to the radar.

10. The solid-state switch according to claim 1, further comprising a radar connection that couples the solid-state switch with a radar such that the output of the solid state switch is communicated to the radar.

11. A solid-state switch comprising:
    a plurality of IGBTs;
    a plurality of driver circuits, wherein each driver circuit of the plurality of driver circuits is coupled with only one IGBT of the plurality of IGBTs;
    a plurality of snubber circuits, wherein at least one snubber circuit of the plurality of snubber circuits is coupled with one IGBT of the plurality of IGBTs; and
    a radar connection that couples the solid-state switch with a radar, wherein the solid-state switch produces 1.2 kV at 600 A with a pulse width modulation greater than 1 MHz;
    wherein the output has a rise time less than 40 ns.

* * * * *